(12) United States Patent
Lee et al.

(10) Patent No.: US 7,288,848 B2
(45) Date of Patent: Oct. 30, 2007

(54) OVERLAY MARK FOR MEASURING AND CORRECTING ALIGNMENT ERRORS

(75) Inventors: Dong-Hun Lee, Anyang-si (KR); Jong-Hyon Ahn, Suwon-si (KR); Do-Yul Yoo, Sungnam-si (KR); Sung-Gun Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 10/997,441

(22) Filed: Nov. 23, 2004

(65) Prior Publication Data

US 2005/0110012 A1 May 26, 2005

(30) Foreign Application Priority Data

Nov. 24, 2003 (KR) .................. 10-2003-0083682

(51) Int. Cl.
*H01L 23/544* (2006.01)
(52) U.S. Cl. .............. 257/797; 257/620; 257/E21.523; 257/E21.524; 257/E23.179
(58) Field of Classification Search ........... 257/797, 257/774, E23.179, 283, E23.523, E23.524, 257/620
See application file for complete search history.

(56) References Cited

U.S. PATENT DOCUMENTS

| | | | |
|---|---|---|---|
| 5,702,567 A | 12/1997 | Mitsui et al. ............ 156/644 |
| 6,037,671 A * | 3/2000 | Kepler et al. ............ 257/797 |
| 6,719,918 B2 * | 4/2004 | Lee et al. ................. 216/79 |
| 6,914,017 B1 * | 7/2005 | Baluswamy et al. ...... 438/401 |
| 2002/0048928 A1 * | 4/2002 | Nakagawa et al. ....... 438/619 |
| 2003/0104690 A1 * | 6/2003 | Matsubara ............... 438/626 |
| 2003/0127751 A1 * | 7/2003 | Yamada et al. .......... 257/797 |
| 2003/0181059 A1 * | 9/2003 | Huang et al. ............ 438/733 |
| 2004/0259320 A1 * | 12/2004 | Holscher et al. ........ 438/401 |
| 2006/0234496 A1 * | 10/2006 | Zhao et al. ............... 438/637 |

FOREIGN PATENT DOCUMENTS

KR 01-5118 1/2001
KR 01-46359 6/2001

* cited by examiner

Primary Examiner—Jasmine Clark
(74) Attorney, Agent, or Firm—Mills & Onello LLP

(57) ABSTRACT

An overlay mark includes at least one hole array formed on a semiconductor substrate and at least one linear trench adjacent to the hole array. The hole array may be formed adjacent to the linear trench along a predetermined direction. When alignment errors among patterns formed at predetermined portion of the semiconductor substrate are detected, the overlay mark may provide a contrast of light with a desired width and a high level so that alignment errors of patterns formed on the semiconductor substrate may be accurately detected and corrected using the overlay mark.

34 Claims, 14 Drawing Sheets

OVERLAY MARK FOR MEASURING AND CORRECTING ALIGNMENT ERRORS

CROSS REFERENCE TO RELATED APPLICATION

This application claims priority under 35 USC § 119 to Korean Patent Application No. 2003-83682, filed on Nov. 24, 2003, the contents of which are incorporated herein by reference in their entirety.

BACKGROUND OF THE INVENTION

1. Field of the Invention

The present invention relates to an overlay mark for measuring and correcting alignment errors of patterns. More particularly, the present invention relates to an overlay mark including a hole array and a linear trench to accurately measure alignment errors of patterns.

2. Description of the Related Art

Integrated circuit devices including minute patterns are generally formed by repeatedly performing unit processes such as a deposition process and a photolithography process. In the photolithography process, after a photoresist film is coated on a layer to be patterned, which is positioned on semiconductor substrate, the photoresist film is exposed and developed to form a photoresist pattern on the layer to be patterned. The layer is etched using the photoresist pattern as an etching mask to thereby form a desired pattern on the semiconductor substrate. When upper and lower patterns of an integrated circuit device are formed by the photolithography process, the upper patterns should be exactly aligned with regard to the lower patterns.

Precise alignments between the upper and lower patterns may be generally achieved through a reticle alignment and a wafer alignment performed in an exposure section of a photolithography apparatus. The alignments of the patterns are corrected in accordance with overlay correction data obtained by an overlay measuring process carried out in the photolithography apparatus. The overlay correction data are obtained by measuring a contrast of light detected from the overlay mark. The alignment errors of the patterns are measured using the overlay mark formed on a scribe line (scribe lane) of a semiconductor substrate, the scribe line dividing the semiconductor substrate into a plurality of dies.

However, alignment errors among patterns formed at predetermined portion of a semiconductor substrate may not be precisely measured using a conventional mark because the overlay mark has a shape and a size substantially different from those of the patterns positioned on the semiconductor substrate as integrated circuit devices have been highly integrated.

FIG. 1 is a plan view illustrating a conventional wafer.

Referring to FIG. 1, a conventional wafer 10 is divided into a plurality of dies 30 by a scribe line 20. Each of the dies 30 corresponds to a portion of the wafer where an integrated circuit device is formed. An overlay mark is formed on the scribe line 20 for aligning patterns of the integrated circuit device.

FIG. 2 is a cross-sectional view illustrating a conventional overlay mark, and FIG. 3 is an electron microscopic photograph illustrating a contrast of light detected from the conventional overlay mark.

Referring to FIG. 2, after a first layer 50 is formed on a semiconductor substrate 40, a first overlay mark 70 is formed on a scribe line B of the semiconductor substrate 40 and also a hole array 60 is formed at a predetermined portion A of the semiconductor substrate 40 where an integrated circuit device is formed. Because a contact size C of the hole array 60 is smaller than a size D of the first overlay mark 70, impurities 80 may be formed on the first overlay mark 70 due to over-etch of the first overlay mark 70 as shown in FIG. 3 when the hole array 60 and the first overlay mark 70 are simultaneously formed by a dry etching process. The impurities 80 are caused by etched by-products of the first layer 50 and a photoresist pattern. That is, the etched by-products are attached on and/or to the first overlay mark 70 to form the impurities 80.

FIG. 4 is a graph schematically illustrating the contrast of light detected from the conventional overlay mark using an overlay measurement apparatus.

Referring to FIGS. 3 and 4, the impurities 802 formed on the overlay mark 70 degrade a contrast of light 90 detected from the overlay mark 70 using an overlay measurement apparatus. Particularly, the impurities 80 cause an abnormal region E in the contrast of light 90 so that the contrast of light 90 may not be exactly detected from the overlay mark 70. Hence, alignment errors among patterns formed on a semiconductor may not be precisely measured using the contrast of the light 90 detected from the overlay mark 70.

FIGS. 5A and 5B are cross-sectional views illustrating a method of forming conventional overlay marks.

Referring to FIGS. 5A and 5B, a first overlay mark 75 and a second overlay mark 115 are formed on a semiconductor substrate 45. After a first layer 55 is formed on the semiconductor substrate 45, the first layer 55 is etched to form the first overlay mark 75 on the semiconductor substrate 45. The first overlay mark 75 has a rectangular shape (see FIG. 5A) or a rectangular band shape (see FIG. 5B). The second overlay mark 115 is formed over the first overlay mark 75, and a second layer 105 is interposed between the second overlay mark 115 and the first overlay mark 75. The second overlay mark 115 has a rectangular shape smaller than the first overlay mark 75.

FIGS. 6A and 6B are plan views illustrating a method of measuring alignment errors using the conventional overlay marks. FIGS. 6A and 6B show the first and second overlay marks 75 and 115 in FIGS. 5A and 5B, respectively.

Referring to FIGS. 6A and 6B, the semiconductor substrate 45 including the first and second overlay marks 75 and 115 is loaded into an overlay measurement apparatus. A horizontal distance dx and a vertical distance dy between the first and second overlay marks 75 and 115 are measured so as to detect alignment errors among patterns formed at a predetermined portion of the semiconductor substrate 45.

Considering the above-mentioned problem, Korean Laid Open Patent Publication No. 2001-5118 discloses an overlay mark including a plurality of minute patterns to properly measure alignment errors of patterns formed on a semiconductor substrate. Here, the minute patterns have sizes of about 0.25 μm to about 0.30 μm. However, when the minute patterns of the overlay mark include grooves of about 0.25 μm to about 0.30 μm, a contrast of light detected from the overlay mark may not be accurately measured because the overlay mark does not have a desired width. Additionally, the contrast of light detected from the overlay mark may not be exactly detected at a desired position when the minute patterns of the overlay mark include lines and spaces of about 0.25 μm to about 0.30 μm. Furthermore, the contrast of light detected from the overlay mark may be degraded when the minute patterns of the overlay mark include contact holes of about 0.25 μm to about 0.30 μm.

SUMMARY OF THE INVENTION

It is one feature of the present invention to provide an overlay mark including at least one hole array and at least one linear trench to accurately detect alignment errors among patterns formed on a semiconductor substrate.

It is another feature of the present invention to provide a method of forming an overlay mark including at least one hole array and at least one linear trench to accurately detect alignment errors among patterns formed on a semiconductor substrate.

It is still another feature of the present invention to provide a method of measuring and correcting alignment errors of patterns formed on a semiconductor substrate using an overlay mark including at least one hole array and at least one linear trench.

In accordance with one aspect of the present invention, there is provided an overlay mark including a hole array formed on a semiconductor substrate, and a linear trench formed adjacent to the hole array in parallel.

In one embodiment, two linear trenches are formed adjacent to lateral portions of the hole array in parallel. The hole array and the linear trenches have sizes less than about five times of critical dimensions of patterns formed at a predetermined portion of the semiconductor substrate where an integrated circuit device is formed. In one embodiment, the hole array and the linear trenches have sizes of about 0.06 µm to about 0.6 µm.

In one embodiment, the hole array has a shape substantially identical to a shape of a contact pattern formed at a predetermined portion of the semiconductor substrate where an integrated circuit device is formed.

In one embodiment, the hole array and the linear trench are simultaneously formed with patterns formed at a predetermined portion of the semiconductor substrate where an integrated circuit device is formed.

In accordance with another aspect of the present invention, there is provided an overlay mark including a first hole array formed on a semiconductor substrate along a first direction, at least one first linear trench formed adjacent to the first hole array, a second hole array formed on the semiconductor substrate along a second direction substantially perpendicular to the first direction, and at least one second linear trench adjacent to the second hole array in parallel.

In one embodiment, the first linear trench is substantially perpendicular to the second linear trench, and the first hole array is separated from the second hole array. The first and second hole arrays and the first and second linear trenches have sizes less than about five times of critical dimensions of patterns formed at a predetermined portion of the semiconductor substrate where an integrated circuit device is formed. The first and second hole arrays and the first and second linear trenches have sizes of about 0.06 µm to about 0.6 µm.

The first and second hole arrays have shapes substantially identical to shapes of contact patterns formed at a predetermined portion of the semiconductor substrate where an integrated circuit device is formed.

The first and second hole arrays and the first and second linear trenches are simultaneously formed with patterns formed at a predetermined portion of the semiconductor substrate where an integrated circuit device is formed.

In accordance with still another aspect of the present invention, there is provided an overlay mark including a first part, a second part corresponding to the first part, a third part and a fourth part corresponding to the third part. The first part has a first hole array formed on a semiconductor substrate along a first direction, and at least one first linear trench adjacent to the first hole array in parallel. The second part includes a second hole array formed on the semiconductor substrate along the first direction, and at least one second linear trench adjacent to the second hole array in parallel. The third part has a third hole array formed on the semiconductor substrate along a second direction perpendicular to the first direction, and at least one third linear trench adjacent to the third hole array in parallel. The fourth part includes a fourth hole array formed on the semiconductor substrate along the second direction, and at least one fourth linear trench adjacent to the fourth hole array in parallel.

In one embodiment, two first to fourth linear trenches are formed adjacent to lateral portions of the first to fourth hole arrays, respectively. The first to the fourth hole arrays are separated from one another, and also the first to the fourth linear trenches are separated from one another. The first to the fourth parts form a substantially rectangular shape without corners.

In one embodiment, the first to fourth hole arrays and the first to fourth linear trenches have sizes less than about five times of critical dimensions of patterns formed at a predetermined portion of the semiconductor substrate where an integrated circuit device is formed.

In one embodiment, the first to fourth hole arrays and the first to fourth linear trenches have sizes of about 0.06 µm to about 0.6 µm.

In one embodiment, the first to fourth hole arrays have shapes substantially identical to shapes of contact patterns formed at a predetermined portion of the semiconductor substrate where an integrated circuit device is formed.

In one embodiment, the first to fourth hole arrays and the first to fourth linear trenches are simultaneously formed with patterns formed at a predetermined portion of the semiconductor substrate where an integrated circuit device is formed.

In accordance with still another aspect of the present invention, there is provided an overlay mark including a linear trench formed on a semiconductor substrate to have a rectangular band shape, and a hole array formed adjacent to the linear trench.

The overlay may include an additional linear trench having a rectangular band shape formed adjacent to the hole array.

In one embodiment, the hole array and the linear trenches have sizes less than about five times of critical dimensions of patterns formed at predetermined portion of the semiconductor substrate where an integrated circuit device is formed. The hole array and the linear trenches have sizes of about 0.06 µm to about 0.6 µm.

According to the present invention, an overlay mark including at least one hole array and at least one linear trench is formed on a scribe line of a semiconductor substrate. The hole array may be formed adjacent to or in the linear trench along a predetermined direction. The overlay mark may provide a contrast of light with a desired width and a high level so that alignment errors of patterns formed on the semiconductor substrate may be accurately detected and corrected using the overlay mark.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

DESCRIPTION OF THE PREFERRED EMBODIMENTS

The present invention now will be described more fully hereinafter with reference to the accompanying drawings, in which embodiments of the invention are shown. It will be understood that when an element such as a layer, region or substrate is referred to as being "on" or "onto" another element, it can be directly on the other element or intervening elements may also be present.

Figure 7:
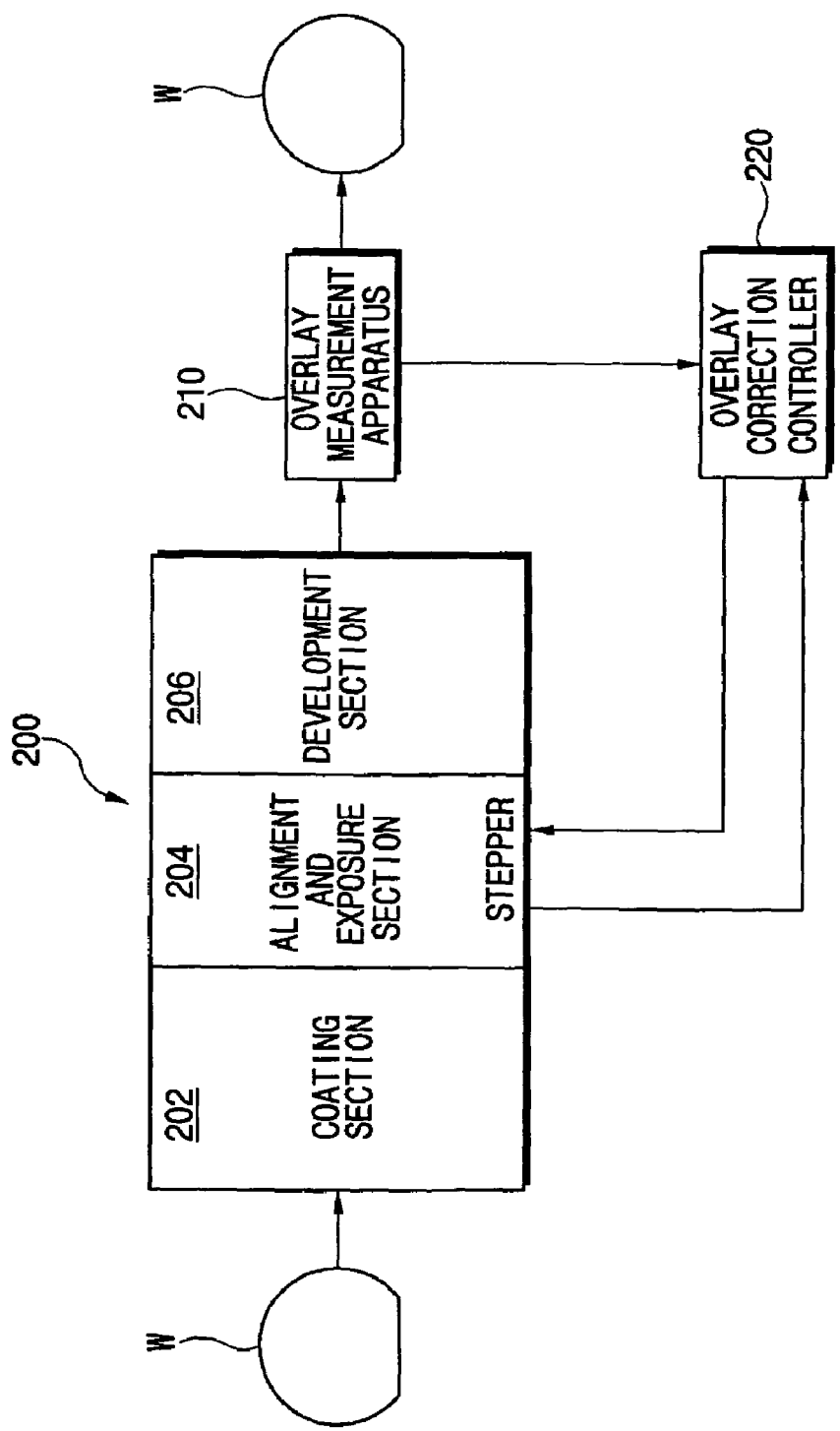
FIG. 7 is a block diagram illustrating a control system of a photolithography apparatus in accordance with one embodiment of the present invention.

FIG. 7 is a block diagram illustrating a control system of a photolithography apparatus in accordance with one embodiment of the present invention.

Referring to FIG. 7, a photolithography apparatus 200 has a coating section 202, an alignment and exposure section 204, and a development section 206.

The photolithography apparatus 200 forms a photoresist pattern on a layer that is to be etched and formed on a wafer W. The layer is etched by a photolithography method to form a pattern on the wafer W. That is, the layer is etched by an etching process using the photoresist pattern as an etching mask so that the pattern is formed on the wafer W. The photolithography method may be repeatedly performed on several layers formed on the wafer W thereby forming multi-layered patterns on the wafer W. The multi-layered patterns constitute an integrated circuit device. The photolithography process is one of main processes for forming the integrated circuit device. The photolithography method generally includes a coating process, an alignment and exposure process, and a development process.

The coating section 202 carries out a pre-baking process, a scrubbing process, a spin coating process and a soft-baking process. In the pre-baking process, moisture is removed from the wafer W and adhesive strength between a photoresist film and the wafer W is increased. The impurities are removed from the wafer W using high-pressure deionized water and a brush during the scrubbing process. The photoresist film is uniformly coated on the wafer W in the spin coating process. In the soft-baking process, solvent included in the photoresist film is evaporated to harden the photoresist film.

The alignment and exposure section 204 performs a pre-alignment process, an alignment process, and an exposure process. A flat zone of the wafer W is fixed to the photolithography apparatus 200 in the pre-alignment process. In the alignment process, reticles are arranged over the wafer W in accordance with a reference mark of a stepper of the alignment and exposure section 204. Additionally, the reticles are aligned relative to the wafer W during the alignment process. The photoresist film is exposed with a predetermined amount of ultra violet light in the exposure process.

The development section 206 executes a post-exposure process, a development process and a hard-baking process. In the post-exposure process, a standing wave effect caused by the ultra violet light relative to the photoresist film is eliminated. After the photoresist film is partially reacted with the ultra violet ray, the reacted portion of the photoresist film is selectively removed in the development process, thereby forming a photoresist pattern on the wafer W. The photoresist pattern is hardened by the hard-baking process so that the photoresist pattern may endure in successive thermal process for manufacturing the integrated circuit.

Figure 8:
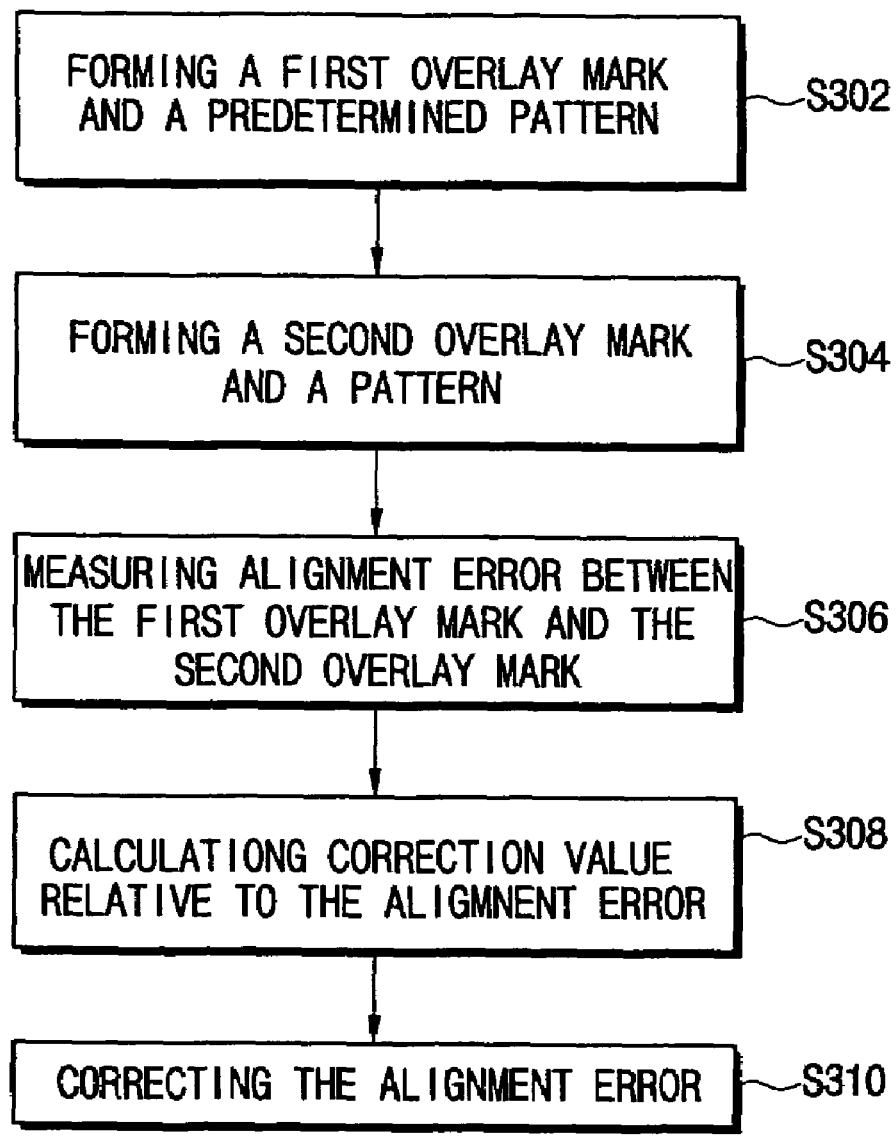
FIG. 8 is a flow chart illustrating a method of measuring overlay accuracy and correcting an alignment error in accordance with one embodiment of the present invention.
Figure 9A:
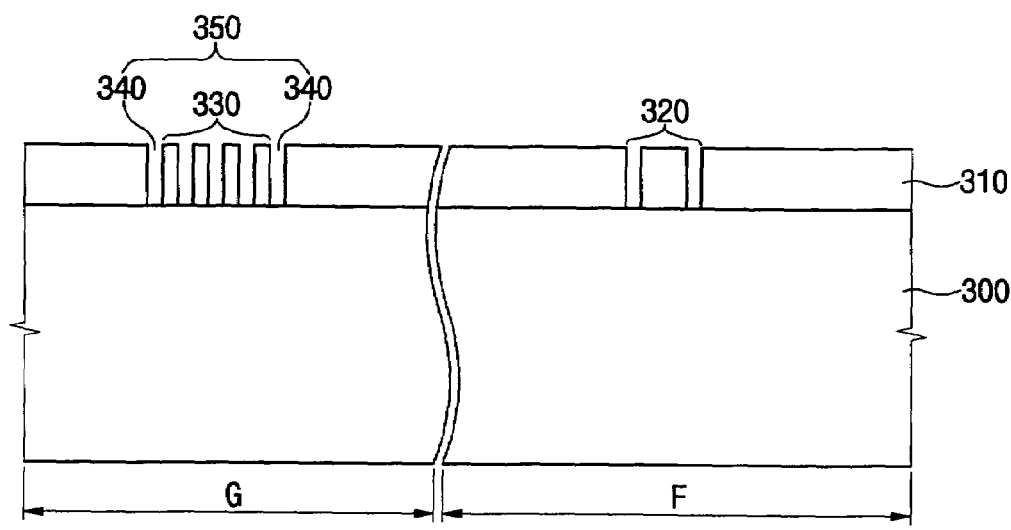
FIGS. 9A and 9B are cross-sectional views illustrating a method of forming an overlay mark on a semiconductor substrate in accordance with one embodiment of the present invention.
Figure 9B:
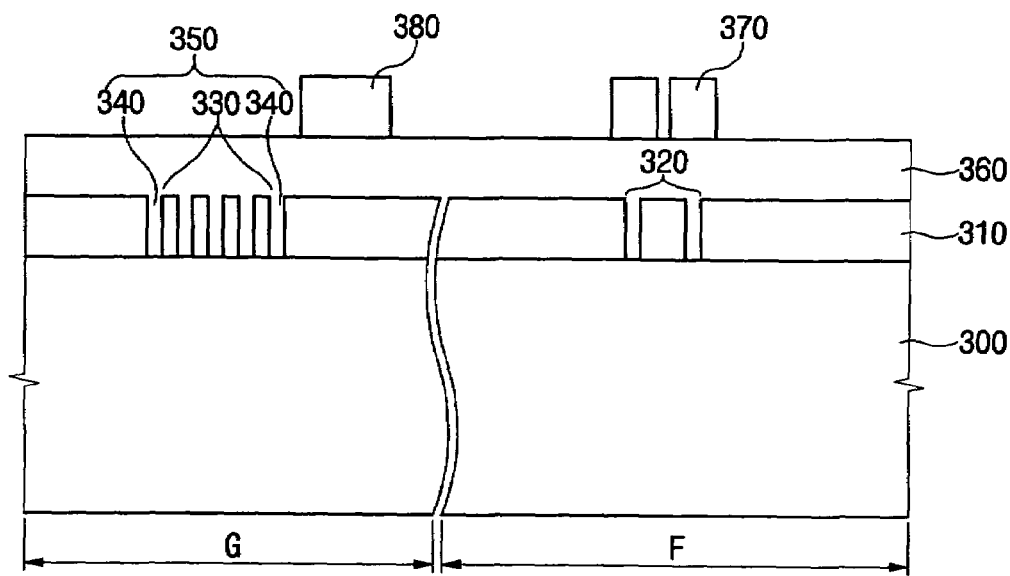

FIG. 8 is a flow chart illustrating a method of measuring overlay accuracy and correcting an alignment error in accordance with one embodiment of the present invention. FIGS. 9A and 9B are cross-sectional views illustrating a method of forming an overlay mark on a semiconductor substrate in accordance with one embodiment of the present invention.

Referring to FIGS. 8 and 9A, a first overlay mark 350 is formed on a scribe line (scribe lane) G of a semiconductor substrate 300 by a photo process and an etching process in step S302. Simultaneously, a predetermined pattern is formed at a portion F of the semiconductor substrate 300. For example, the predetermined pattern may include a hole array or a contact pattern. The first overlay mark 350 and the predetermined pattern are formed by etching a first layer positioned on the semiconductor substrate 300. An integrated circuit device is formed at a portion F of the semiconductor substrate 300. The first overlay mark 350 may be served for forming the integrated circuit device at the portion F of the semiconductor substrate 300.

Particularly, the first layer 310 is formed on the semiconductor substrate 300 as shown in FIG. 9A. The first layer 310 may include an insulating interlayer. The first layer 310 is patterned to form the predetermined pattern including a hole array 320 at the portion F of the semiconductor substrate 300 and to form the first overlay mark 350 on the scribe line G of the semiconductor substrate 300. The first overlay mark 350 includes a hole array 330 and a linear trench 340 adjacent to the second hole array 330.

Figure 10A:
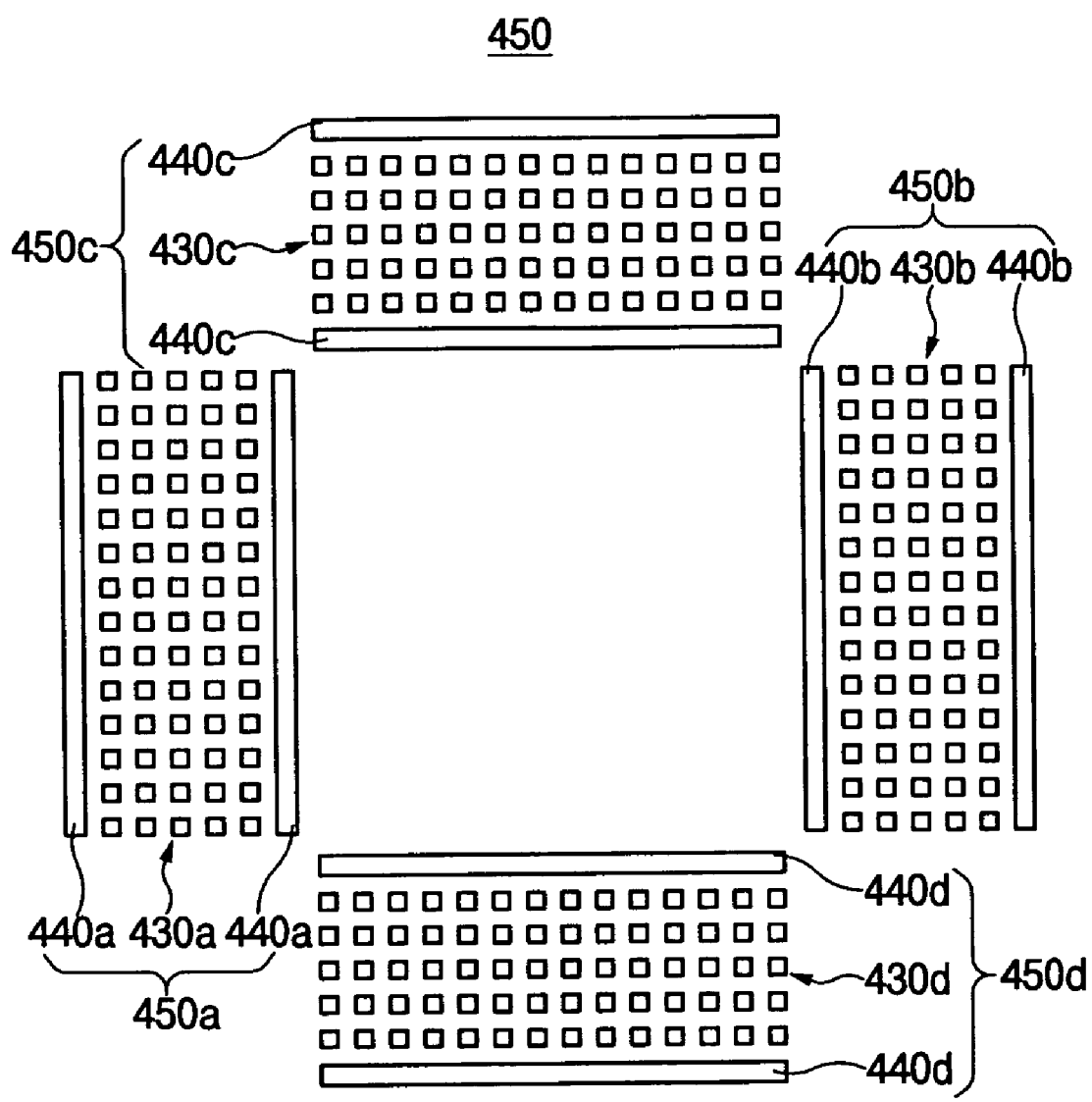
FIG. 10A is a plan view illustrating a first overlay mark in accordance with one embodiment of the present invention.

FIG. 10A is a plan view illustrating a first overlay mark in accordance with one embodiment of the present invention.

Referring to FIG. 10A, a first overlay mark 450 is formed on a semiconductor substrate (not shown) by etching a first layer (not shown) using the above-described process. The first overlay mark 450 includes a first part 450a, a second part 450b, a third part 450c and a fourth part 450d. The first part 450a is formed on the semiconductor substrate along a first direction, whereas the second part 450b corresponding to the first part 450a is positioned on the semiconductor substrate along the first direction. The third part 450c is formed on the semiconductor substrate along a second direction perpendicular to the first direction. In addition, the fourth part 450d corresponding to the third part 450c is formed on the semiconductor substrate along the second direction. Thus, the first and third parts 450a and 450c are substantially parallel to the second and fourth parts 450b and 450d, respectively, whereas the first and second parts 450a and 450b are substantially perpendicular to the third and fourth parts 450c and 450d, respectively. The first to the fourth parts 450a, 450b, 450c and 450d are separated from one another by predetermined intervals. That is, the first overlay mark 450 may have a rectangular shape without corners.

The first part 450a includes a first hole array 430a formed on the semiconductor substrate along the first direction, and a first linear trench 440a adjacent to the first hole array 430a. The second part 450b includes a second hole array 430b positioned on the semiconductor substrate along the first direction, and a second linear trench 440b adjacent to the second hole array 430b. The third part 450c includes a third hole array 430c formed on the semiconductor substrate along the second direction, and a third linear trench 440c adjacent to the third hole array 430c. Similarly, the fourth part 450d includes a fourth hole array 430d formed on the semiconductor substrate along the second direction, and a fourth linear trench 440d adjacent to the fourth hole array 430d. Holes or linear trenches may not be formed at corners of the semiconductor substrate among the first to fourth parts 450a, 450b, 450c and 450d because the corners have no effect on an alignment process.

The first to fourth hole arrays 430a, 430b, 430c and 430d have sizes less than about five times of a critical dimension (CD) of an integrated circuit device formed at a predetermined portion of the semiconductor substrate. For example, the first to fourth hole arrays 430a, 430b, 430c and 430d have sizes of about 0.06 μm to about 0.6 μm. Additionally, the first to fourth linear trenches 440a, 440b, 440c and 440d have sizes substantially identical to those of the first to fourth hole arrays 430a, 430b, 430c and 430d. Each of the first to fourth hole arrays 430a, 430b, 430c and 430d has a shape substantially identical to that of a contact pattern formed at the predetermined portion of the semiconductor substrate. The predetermined portion of the semiconductor substrate is generally enclosed by the first to fourth parts 450a, 450b, 450c and 450d.

Preferably, all of the hole arrays 430a, 430b, 430c and 430d and the linear trenches 440a, 440b, 440c and 440d are simultaneously formed. In addition, the contact pattern is simultaneously formed with the hole arrays 430a, 430b, 430c and 430d and the linear trenches 440a, 440b, 440c and 440d.

Referring now to FIGS. 8 and 9B, a desired pattern 370 is formed at the portion F of the semiconductor substrate 300, and a second overlay mark 380 is simultaneously formed over the scribe line G of the semiconductor substrate 300 in step S304. As shown in FIG. 9B, after a second layer 360 is formed on the semiconductor substrate 300 to cover the hole array 320 and the first overlay mark 350, the second layer 360 is etched by a photolithography process to thereby form the second overlay mark 380 over the scribe line G and the desired pattern 370 at the portion F where the integrated circuit device is formed. The second overlay mark 380 may have a size substantially identical to that of the desired pattern 370. Alternatively, the second overlay mark 380 may have a size different from that of the desired pattern 370.

Figure 10B:
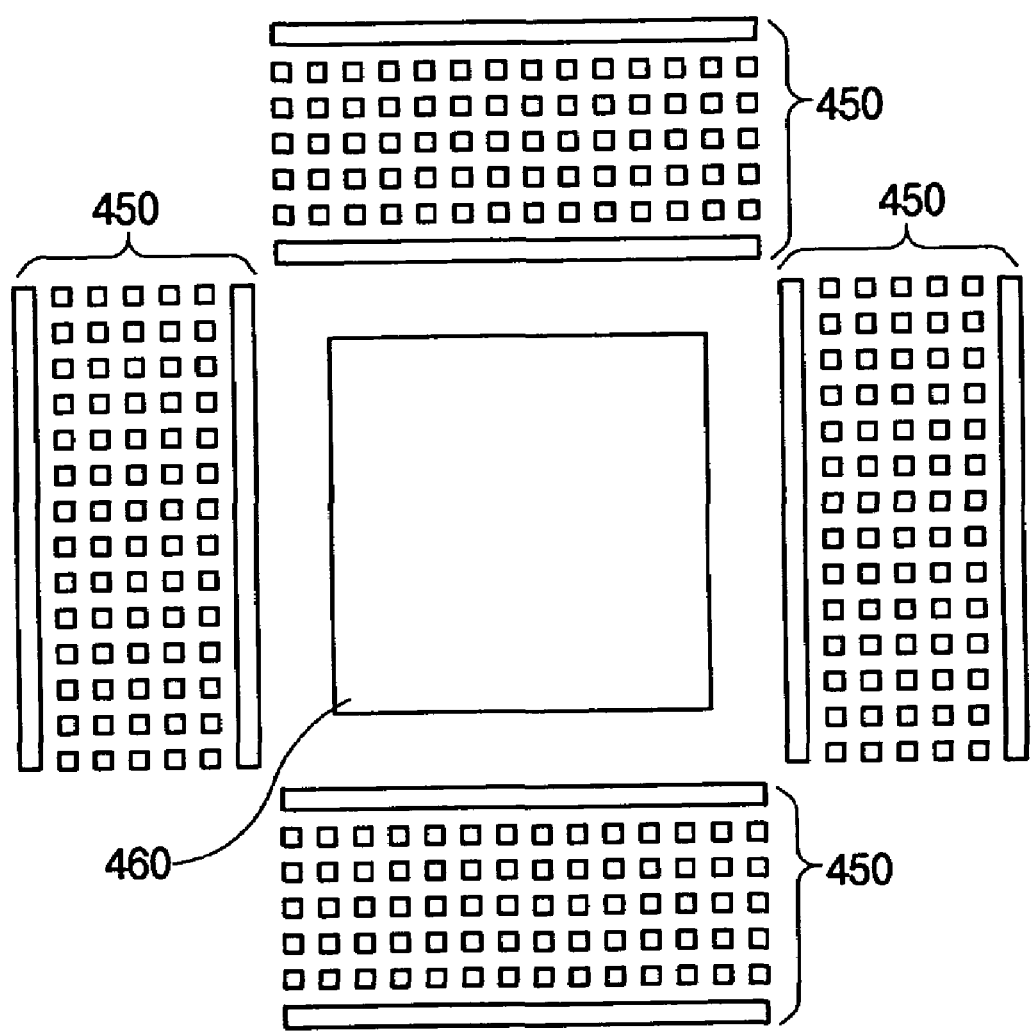
FIG. 10B is a plan view illustrating the first overlay mark and a second overlay mark in accordance with one embodiment of the present invention.

FIG. 10B is a plan view illustrating the first overlay mark and a second overlay mark in accordance with one embodiment of the present invention.

Referring to FIG. 10B, a second overlay mark 460 positioned on a second layer is substantially enclosed by the first overlay mark 450. Preferably, the second overlay mark 460 has a rectangular shape.

Referring now to FIGS. 7, 8 and 9B, in step S306, the semiconductor substrate 300 including the first and second overlay marks 350 and 380 is loaded into an overlay measurement-apparatus 210 to measure an alignment error between the desired pattern 370 and the hole array 320 using an alignment error of the second overlay mark 380 relative to the first overlay mark 350. After the desired pattern 370 is formed over the hole array 320, the alignment error between the desired pattern 370 and the hole array 320 is measured using the overlay measurement apparatus 210 to identify whether the alignment error is an allowable error or not. The overlay measurement apparatus 210 may not measure all of alignment errors among patterns formed at the portion F of the semiconductor substrate 300. The overlay measurement apparatus 210 measures the alignment error between the first overlay mark 350 and the second overlay mark 380 to thereby identify all of the alignment errors of the patterns positioned at the portion F of the semiconductor substrate 300. That is, the first and second overlay marks 350 and 380 serve to measure and identify the alignment errors among the patterns of the integrated circuit device.

Figure 11:
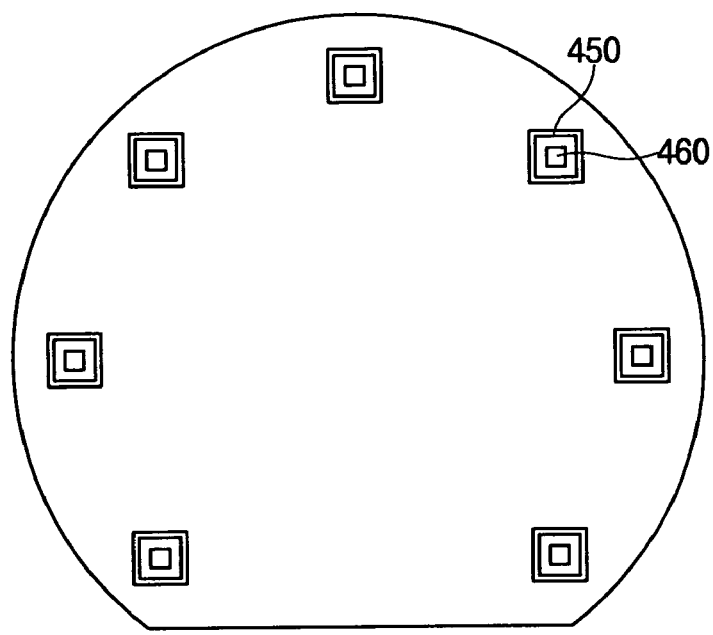
FIG. 11 is a plan view illustrating a wafer including several portions for measuring alignment errors in accordance with one embodiment of the present invention.

FIG. 11 is a plan view illustrating a wafer including several portions for measuring alignment errors among patterns in accordance with one embodiment of the present invention.

Figure 1:
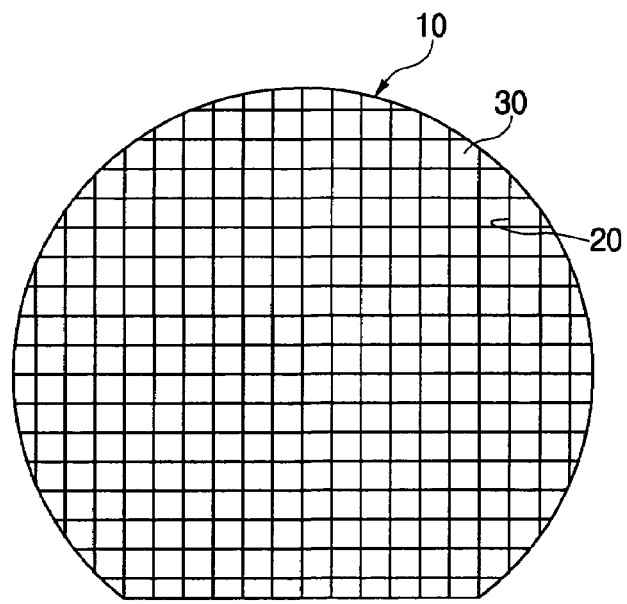
FIG. 1 is a plan view illustrating a conventional wafer.
Figure 2:
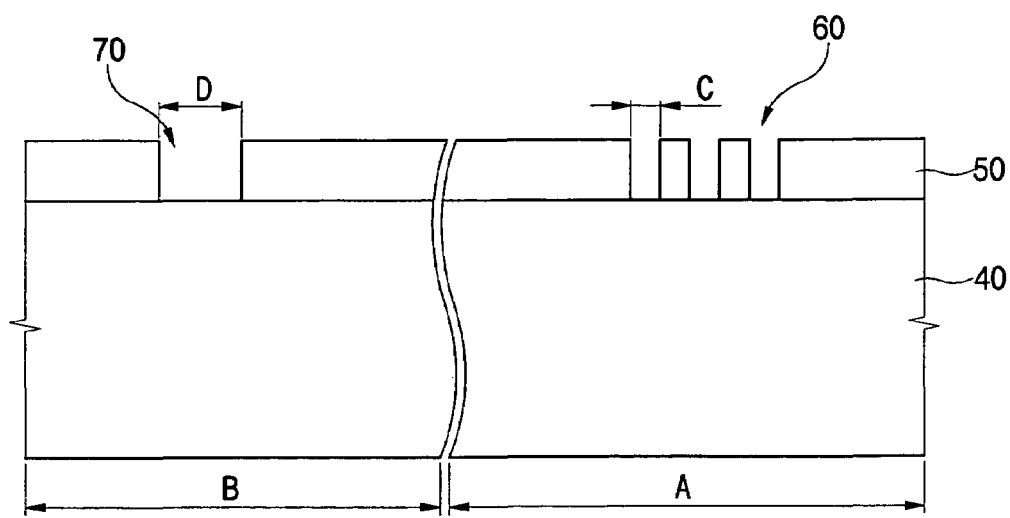
FIG. 2 is a cross-sectional view illustrating a conventional overlay mark.
Figure 3:
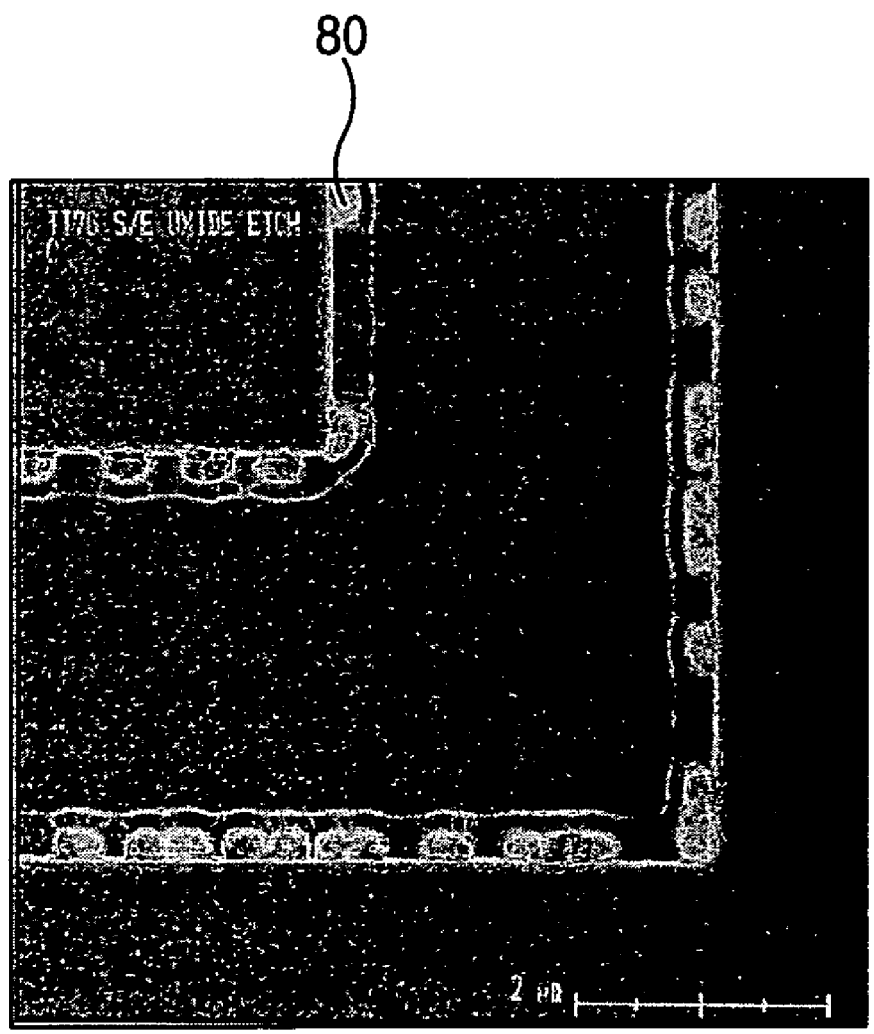
FIG. 3 is an electron microscopic photograph illustrating a contrast of light detected from the conventional overlay mark.
Figure 4:
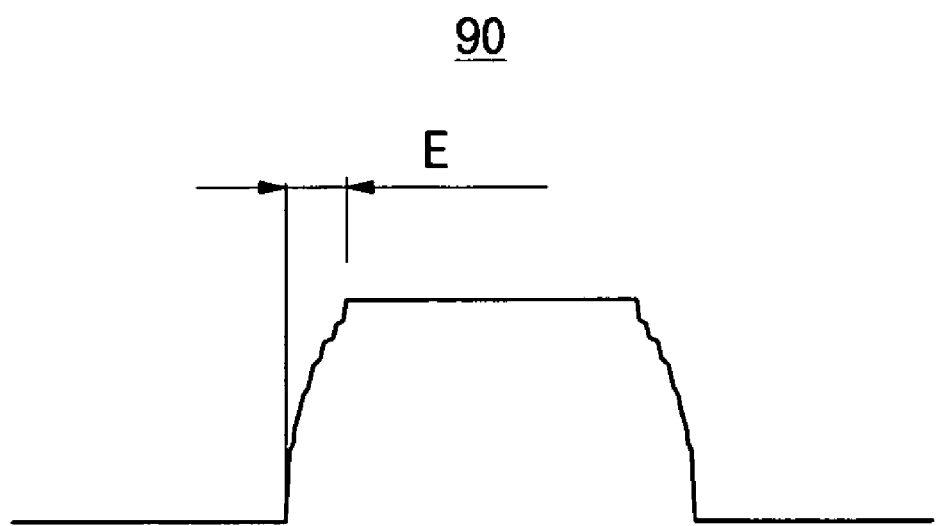
FIG. 4 is a graph schematically illustrating the contrast of light detected from the conventional overlay mark using an overlay measurement apparatus.
Figure 5A:
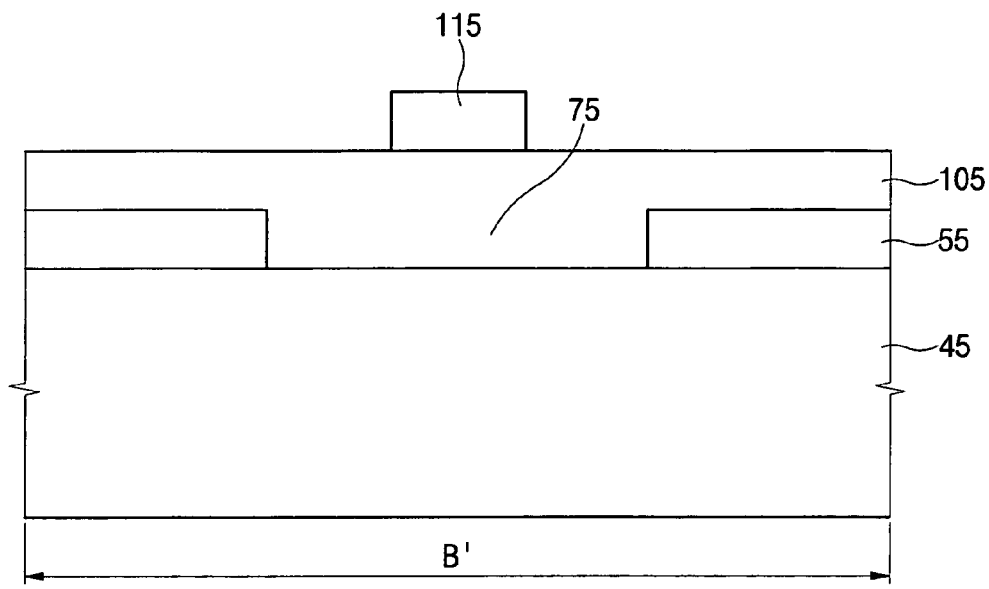
FIGS. 5A and 5B are cross-sectional views illustrating a method of forming conventional overlay marks.
Figure 5B:
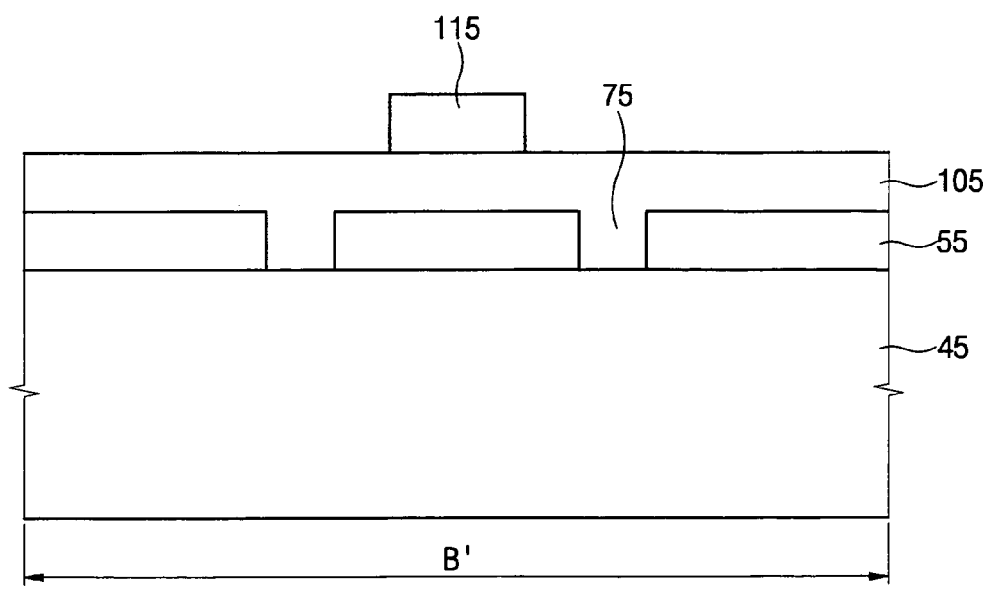
Figure 6A:
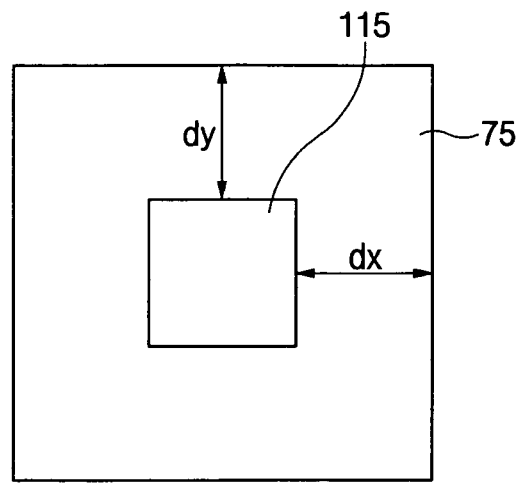
FIGS. 6A and 6B are plan views illustrating a method of measuring alignment errors using the conventional overlay marks.
Figure 6B:
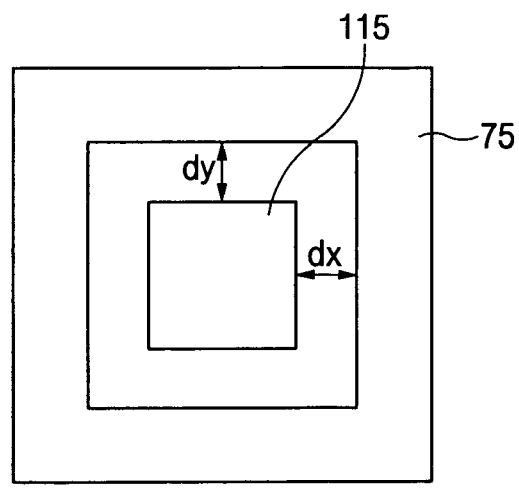

Referring to FIG. 11, after one of the portions for measuring alignment errors of patterns is selected, interval ratios, that is dx/dy (see FIG. 6B), between a first overlay mark 450 and a second overlay mark 460 of the selected portion are measured. Parameters concerning alignment errors of the patterns are extracted through regression analysis of the interval ratios between the first overlay mark 450 and the second overlay mark 460.

The parameters concerning the alignment errors are obtained by detecting contrast difference of light between the first overlay mark 450 and the second overlay mark 460 after light is irradiated onto the first and second overlay marks 450 and 460.

Figure 12:
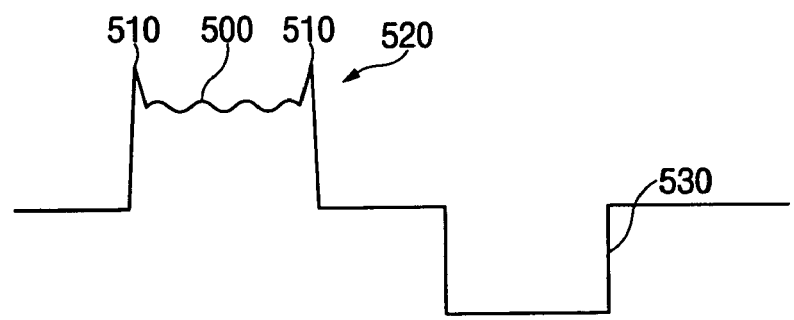
FIG. 12 is a graph schematically illustrating contrasts of light detected using an alignment error measurement apparatus in accordance with one embodiment of the present invention.

FIG. 12 is a graph schematically illustrating contrasts of light detected using an alignment error measurement apparatus in accordance with one embodiment of the present invention.

Referring to FIG. 12, a contrast of light 520 detected from a first overlay mark includes a contrast of light 500 detected from a hole array and a contrast of light 510 detected from a linear trench. A contrast of light 530 detected from a second overlay mark is lower than the contract of light 520 detected from the first overlay mark.

The contrast of light 520 detected from the first overlay mark has a desired width and a relatively high level. Hence, the overlay measurement apparatus may accurately detect the alignment errors of patterns formed at portion of the wafer where an integrated circuit device is formed.

Referring now to FIGS. 7 and 8, in step S308, the overlay measurement apparatus 210 provides overlay correction controller 220 with measured parameters, measured time and lot identification (ID).

In step S310, after the overlay correction controller 220 generates overlay correction values using the provided parameters, time and lot identification (ID), the overlay correction controller 220 provides the stepper of the alignment and exposure section 204 with the overlay correction values, thereby correcting the alignment errors of the patterns in accordance with the overlay correction of the stepper. Therefore, alignment errors among the patterns may be reduced by the alignment error correction achieved as described above.

Figure 13:
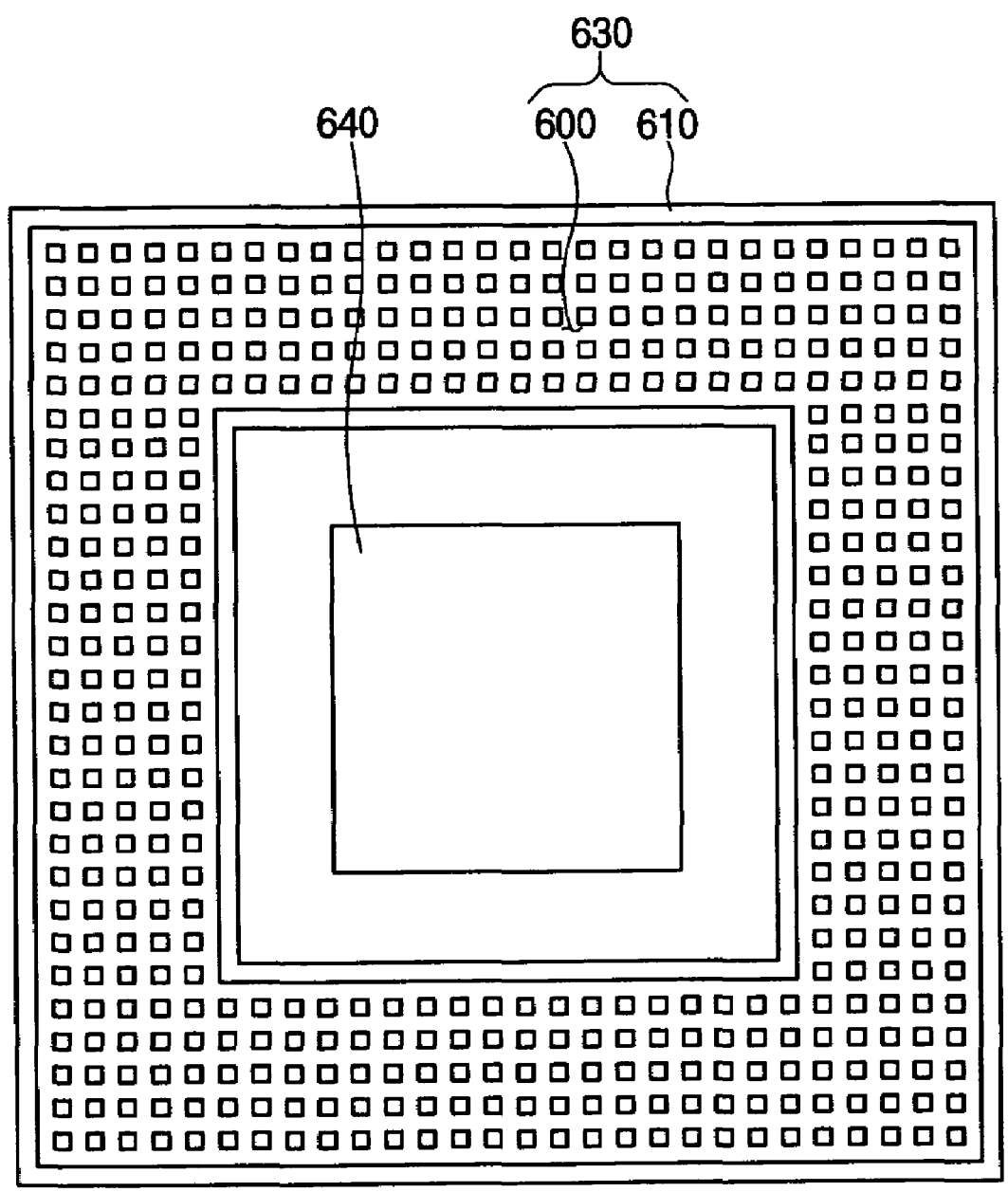
FIG. 13 is a plan view illustrating overlay marks in accordance with one embodiment of the present invention.

FIG. 13 is a plan view illustrating overlay marks in accordance with one embodiment of the present invention.

Referring to FIG. 13, a first overlay mark 630 is formed on a semiconductor substrate. The first overlay mark 630 includes a hole array 600 and a linear trench 610. The hole array 600 is arranged to have a rectangular band shape, and the linear trench 610 is formed adjacent to the hole array 600.

The hole array 600 and the linear trench 610 have sizes less than about five times of a critical dimension (CD) of an integrated circuit device formed at a predetermined portion of the semiconductor substrate. For example, the hole array 600 and the linear trench 610 have sizes of about 0.06 µm to about 0.6 µm. The hole array 600 has a shape substantially identical to that of a contact pattern formed at the predetermined portion of the semiconductor substrate. Preferably, the hole array 600 and the linear trench 610 may be simultaneously formed. In addition, the contact pattern is simultaneously formed with the hole array 600 and the linear trench 610.

The first overlay mark 630 is formed adjacent to a second overlay mark 640 formed over the first overlay mark 630. The second overlay mark 640 has a substantially rectangular shape.

Using the first and second overlay marks 630 and 640, alignment errors among patterns formed at a predetermined portion of the semiconductor substrate may be accurately corrected in accordance with the above described overlay correction method.

Figure 14:
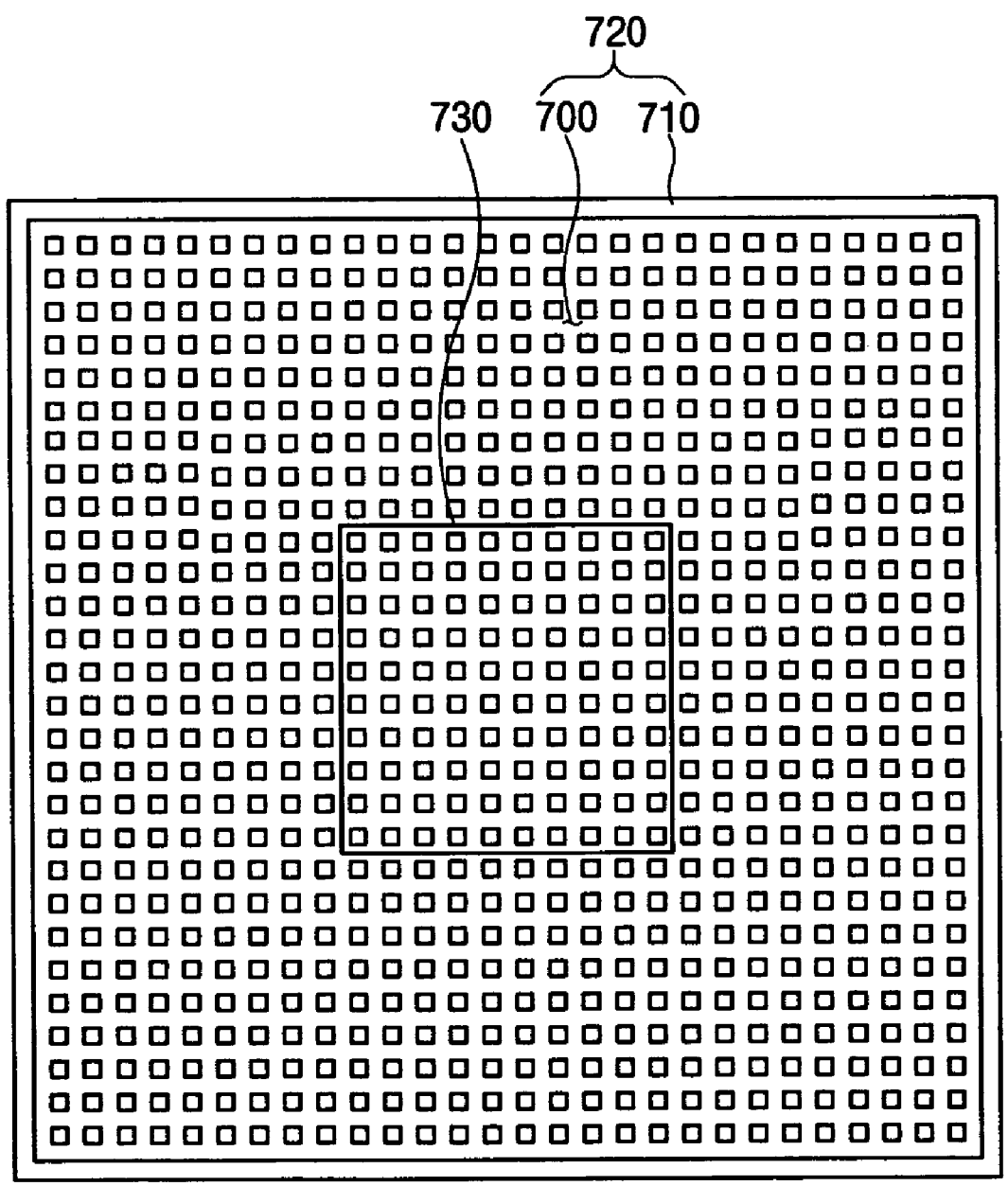
FIG. 14 is a plan view illustrating overlay marks in accordance with one embodiment of the present invention.

FIG. 14 is a plan view illustrating overlay marks in accordance with one embodiment of the present invention.

Referring to FIG. 14, a first overlay mark 720 having a hole array 700 and a linear trench 710 is formed on a semiconductor substrate. The hole array 700 substantially has a rectangular shape, and the linear trench 710 substantially has a rectangular band shape. The linear trench 710 is formed adjacent to a lateral portion of the hole array 700.

The hole array 700 and the linear trench 710 have sizes about one to about five times larger than critical dimensions (CD) of patterns formed at a predetermined portion of the semiconductor substrate where an integrated circuit device is formed. For example, the hole array 700 and the linear trench 710 have sizes of about 0.06 µm to about 0.6 µm.

A second overlay mark 730 is formed over the hole array 700 of the first overlay mark 720. Particularly, the second overlay mark 730 is substantially positioned over a central portion of the hole array 700.

Figure 15:
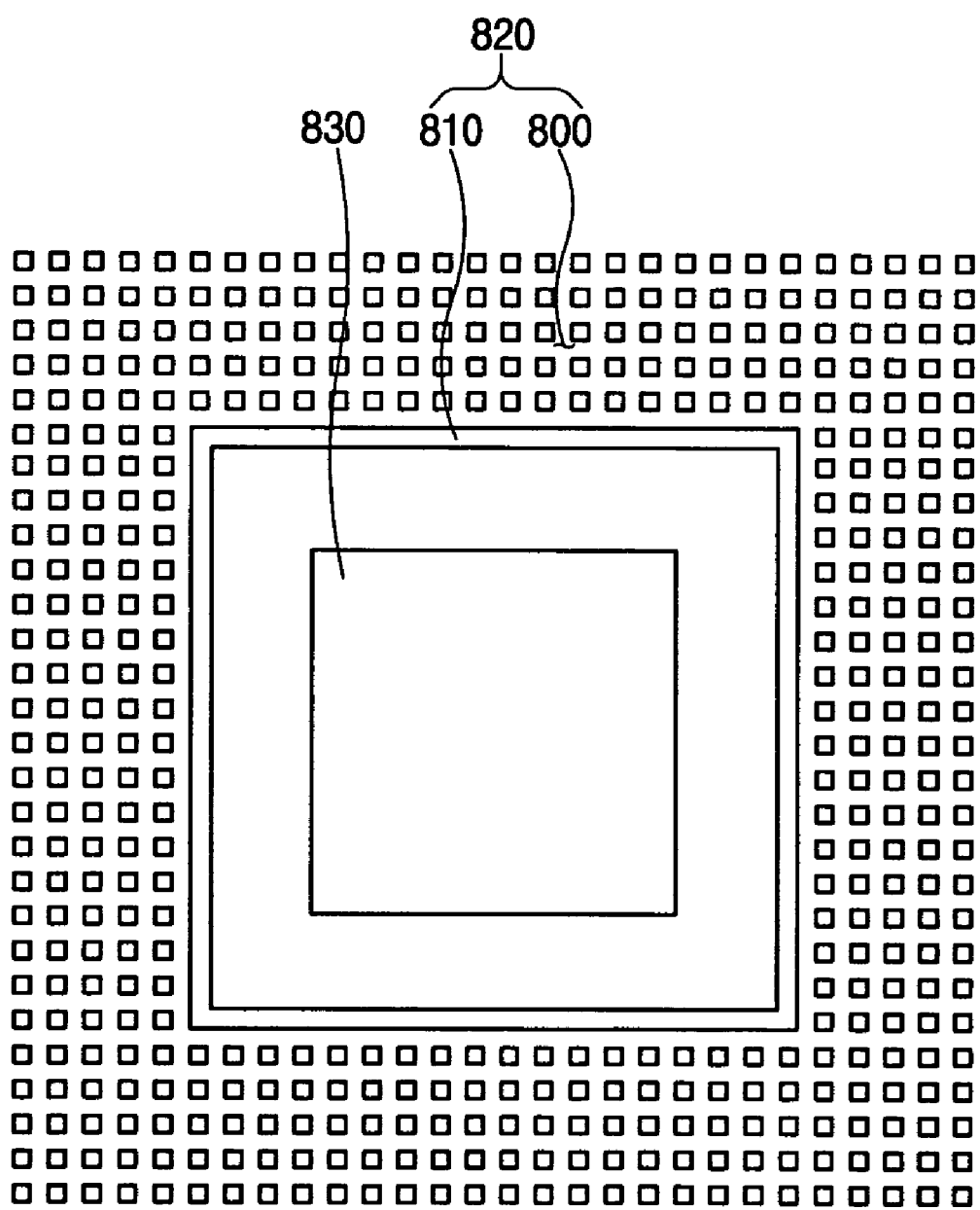
FIG. 15 is a plan view illustrating overlay marks in accordance with one embodiment of the present invention.

FIG. 15 is a plan view illustrating overlay marks in accordance with one embodiment of the present invention.

Referring to FIG. 15, a first overlay mark 820 is formed on a semiconductor substrate to include a hole array 800 and a linear trench 810. Both of the hole array 800 and the linear trench 810 substantially have a rectangular band shapes. The hole array 800 is formed on the semiconductor substrate near the linear trench 810. Accordingly, the linear trench 810 does not enclose the hole array 800. Alternatively, an additional linear trench of a rectangular shape may be formed on the semiconductor substrate so that two linear trenches are formed adjacent to lateral portions of the hole array 800 positioned. Here, the hole array 800 and the linear trenches 810 have sizes about one to about five times larger than critical dimensions (CD) of patterns formed at a predetermined portion of the semiconductor substrate where an integrated circuit device is formed. For example, the hole array 800 and the linear trenches 810 have sizes of about 0.06 µm to about 0.6 µm.

Particularly, a second overlay mark 830 is substantially formed at a central portion of the first overlay mark 820, and the linear trench 810 adjacent to the second overlay mark 830.

According to the present invention, an overlay mark including at least one hole array and at least one linear trench is formed on a scribe line of a semiconductor substrate. The hole array may be formed in the linear trench or near the linear trench along a predetermined direction. The overlay mark may provide a contrast of light with a desired width and a high level so that alignment errors of patterns formed on the semiconductor substrate may be accurately detected and corrected. Here, the patterns including hole arrays and contact patterns are formed at predetermined portion of the semiconductor substrate where an integrated circuit device is formed.

Having thus described exemplary embodiments of the present invention, it is to be understood that the invention defined by the appended claims is not to be limited by particular details set forth in the above description as many apparent variations thereof are possible departing from the spirit or scope thereof as hereinafter claimed.

What is claimed is:

1. An overlay mark comprising:
   a hole array comprising a plurality of holes disposed in a direction, the hole array formed on a scribe line of a semiconductor substrate; and
   at least one linear trench extending in the direction, the at least one linear trench being formed on the scribe line of the semiconductor substrate adjacent to the plurality of holes of the hole array in parallel.

2. The overlay mark of claim 1, wherein two linear trenches are formed adjacent to lateral portions of the hole array in parallel.

3. The overlay mark of claim 2, wherein the hole array and the linear trenches have sizes less than about five times of critical dimensions of patterns formed at a predetermined portion of the semiconductor substrate where an integrated circuit device is positioned.

4. The overlay mark of claim 3, wherein the hole array and the linear trenches have sizes of about 0.06 µm to about 0.6 µm.

5. The overlay mark of claim 1, wherein the hole array has a shape substantially identical to a shape of a contact pattern formed at a predetermined portion of the semiconductor substrate where an integrated circuit device is formed.

6. The overlay mark of claim 1, wherein the hole array and the linear trench are simultaneously formed with patterns formed at a predetermined portion of the semiconductor substrate where an integrated circuit device is formed.

7. An overlay mark comprising:
a first hole array formed on a scribe line of a semiconductor substrate in a first direction;
a first linear trench extending in the first direction, the first linear trench formed on the scribe line of the semiconductor substrate adjacent to the first hole array in parallel;
a second hole array formed on the semiconductor substrate in a second direction substantially perpendicular to the first direction; and
a second linear trench formed adjacent to the second hole array in parallel.

8. The overlay mark of claim 7, wherein the first linear trench is substantially perpendicular to the second linear trench.

9. The overlay mark of claim 7, wherein the first hole array is separated from the second hole array.

10. The overlay mark of claim 7, wherein the first and second hole arrays and the first and second linear trenches have sizes less than about five times of critical dimensions of patterns formed at a predetermined portion of the semiconductor substrate where an integrated circuit device is formed.

11. The overlay mark of claim 10, wherein the first and second hole arrays and the first and second linear trenches have sizes of about 0.06 µm to about 0.6 µm.

12. The overlay mark of claim 7, wherein the first and second hole arrays have shapes substantially identical to shapes of contact patterns formed at a predetermined portion of the semiconductor substrate where an integrated circuit device is formed.

13. The overlay mark of claim 7, wherein the first and second hole arrays and the first and second linear trenches are simultaneously formed with patterns formed at a predetermined portion of the semiconductor substrate where an integrated circuit device is formed.

14. An overlay mark comprising:
a first part having a first hole array formed on a scribe line of a semiconductor substrate in a first direction, and at least one first linear trench extending in the first direction formed on the scribe line of the semiconductor substrate adjacent to the first hole array in parallel;
a second part having a second hole array formed on the semiconductor substrate in the first direction, and at least one second linear trench formed adjacent to the second hole array in parallel, the second part corresponding to the first part;
a third part having a third hole array formed on the semiconductor substrate in a second direction perpendicular to the first direction, and at least one third linear trench formed adjacent to the third hole array in parallel; and
a fourth part having a fourth hole array formed on the semiconductor substrate in the second direction, and at least one fourth linear trench formed adjacent to the fourth hole array in parallel, the fourth part corresponding to the third part.

15. The overlay mark of claim 14, wherein two first to fourth linear trenches are formed adjacent to lateral portions of the first to fourth hole arrays, respectively.

16. The overlay mark of claim 14, wherein the first to the fourth hole arrays are separated from one another.

17. The overlay mark of claim 14, wherein the first to the fourth linear trenches are separated from one another.

18. The overlay mark of claim 14, wherein the first to the fourth parts form a substantially rectangular shape without corners.

19. The overlay mark of claim 14, wherein the first to fourth hole arrays and the first to fourth linear trenches have sizes less than about five times of critical dimensions of patterns formed at a predetermined portion of the semiconductor substrate where an integrated circuit device is formed.

20. The overlay mark of claim 19, wherein the first to fourth hole arrays and the first to fourth linear trenches have sizes of about 0.06 µm to about 0.6 µm.

21. The overlay mark of claim 14, wherein the first to fourth hole arrays have shapes substantially identical to shapes of contact patterns formed at predetermined portion of the semiconductor substrate where an integrated circuit device is formed.

22. The overlay mark of claim 14, wherein the first to fourth hole arrays and the first to fourth linear trenches are simultaneously formed with patterns formed at a predetermined portion of the semiconductor substrate where an integrated circuit device is formed.

23. An overlay mark comprising:
a linear trench extending in a direction formed on a scribe line of a semiconductor substrate to have a rectangular band shape; and
a hole array comprising a plurality of holes disposed in the direction, the hole array formed on the scribe line of the semiconductor substrate adjacent to the linear trench.

24. The overlay mark of claim 23, further comprising an additional linear trench having a rectangular shape adjacent to the hole array.

25. The overlay mark of claim 23, wherein the hole array and the linear trenches have sizes less than about five times of critical dimensions of patterns formed at a predetermined portion of the semiconductor substrate where an integrated circuit device is formed.

26. The overlay mark of claim 25, wherein the hole array and the linear trenches have sizes of about 0.06 µm to about 0.6 µm.

27. An overlay mark comprising:
a hole array formed on a semiconductor substrate; and
at least one linear trench formed adjacent to the hole array in parallel, wherein two linear trenches are formed adjacent to lateral portions of the hole array in parallel, and wherein the hole array and the linear trenches have sizes less than about five times of critical dimensions of patterns formed at a predetermined portion of the semiconductor substrate where an integrated circuit device is positioned.

28. The overlay mark of claim 27, wherein the hole array and the linear trenches have sizes of about 0.06 µm to about 0.6 µm.

29. An overlay mark comprising:
a linear trench formed on a semiconductor substrate to have a rectangular band shape; and
a hole array formed adjacent to the linear trench, wherein the hole array and the linear trenches have sizes less than about five times of critical dimensions of patterns formed at a predetermined portion of the semiconductor substrate where an integrated circuit device is formed.

30. The overlay mark of claim 29, wherein the hole array and the linear trenches have sizes of about 0.06 µm to about 0.6 µm.

31. An overlay mark comprising:
a first hole array formed on a semiconductor substrate along a first direction;
a first linear trench formed adjacent to the first hole array in parallel;
a second hole array formed on the semiconductor substrate along a second direction substantially perpendicular to the first direction; and
a second linear trench formed adjacent to the second hole array in parallel, wherein the first and second hole arrays and the first and second linear trenches have sizes less than about five times of critical dimensions of patterns formed at a predetermined portion of the semiconductor substrate where an integrated circuit device is formed.

32. The overlay mark of claim 31, wherein the first and second hole arrays and the first and second linear trenches have sizes of about 0.06 µm to about 0.6 µm.

33. An overlay mark comprising:
a first part having a first hole array formed on a semiconductor substrate along first direction, and at least one first linear trench formed adjacent to the first hole array in parallel;
a second part having a second hole array formed on the semiconductor substrate along the first direction, and at least one second linear trench formed adjacent to the second hole array in parallel, the second part corresponding to the first part;
a third part having a third hole array formed on the semiconductor substrate along a second direction perpendicular to the first direction, and at least one third linear trench formed adjacent to the third hole array in parallel; and
a fourth part having a fourth hole array formed on the semiconductor substrate along the second direction, and at least one fourth linear trench formed adjacent to the fourth hole array in parallel, the fourth part corresponding to the third part, wherein the first to fourth hole arrays and the first to fourth linear trenches have sizes less than about five times of critical dimensions of patterns formed at a predetermined portion of the semiconductor substrate where an integrated circuit device is formed.

34. The overlay mark of claim 33, wherein the first to fourth hole arrays and the first to fourth linear trenches have sizes of about 0.06 µm to about 0.6 µm.

\* \* \* \* \*